(12) United States Patent
Sudoh

(10) Patent No.: US 6,563,652 B2
(45) Date of Patent: May 13, 2003

(54) LENS BARREL AND PROJECTION ALIGNER

(75) Inventor: Yuji Sudoh, Hadano (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/902,597

(22) Filed: Jul. 12, 2001

(65) Prior Publication Data

US 2001/0038497 A1 Nov. 8, 2001

Related U.S. Application Data

(62) Division of application No. 09/296,563, filed on Apr. 22, 1999, now Pat. No. 6,285,512.

(30) Foreign Application Priority Data

| Apr. 23, 1998 | (JP) | ............................................ 10-129523 |
| Apr. 21, 1999 | (JP) | ............................................ 11-113413 |

(51) Int. Cl.⁷ ............................ G02B 15/14; G02B 7/02
(52) U.S. Cl. ...................... 359/704; 359/703; 359/819
(58) Field of Search .............................. 359/703, 704, 359/620, 811, 813, 817, 819, 820

(56) References Cited

U.S. PATENT DOCUMENTS

| 4,043,644 | A | 8/1977 | Humphrey | ................ 350/295 |
| 4,676,631 | A | 6/1987 | Kosugi et al. | ................ 355/55 |
| 5,428,482 | A | 6/1995 | Bruning et al. | ............. 359/827 |
| 5,636,000 | A | 6/1997 | Ushida et al. | ................ 355/30 |
| 5,731,909 | A | 3/1998 | Schachar | .................... 359/676 |
| 6,122,114 | A | 9/2000 | Sudo et al. | ................. 359/819 |

FOREIGN PATENT DOCUMENTS

| DE | 196 23 418 | 12/1997 |
| JP | 60-170812 | 9/1985 |
| JP | 10-133150 | 5/1998 |
| JP | 10-160996 | 6/1998 |
| JP | 10-186196 | 9/1998 |
| JP | 10-256142 | 9/1998 |
| JP | 10-301026 | 11/1998 |
| WO | WO 96/13741 | 5/1996 |

*Primary Examiner*—Ricky Mack
(74) *Attorney, Agent, or Firm*—Fitzpatrick, Cella, Harper & Scinto

(57) ABSTRACT

A lens barrel includes an optical element having a light-transmissive surface which is deformed by its own weight and/or by being supported, and a plurality of protrusive parts which support the optical element. The plurality of protrusive parts are disposed in such a way as to enable the light-transmissive surface of the optical element to be deformed symmetrically with respect to a plane which includes an optical axis.

71 Claims, 8 Drawing Sheets

F I G. 12
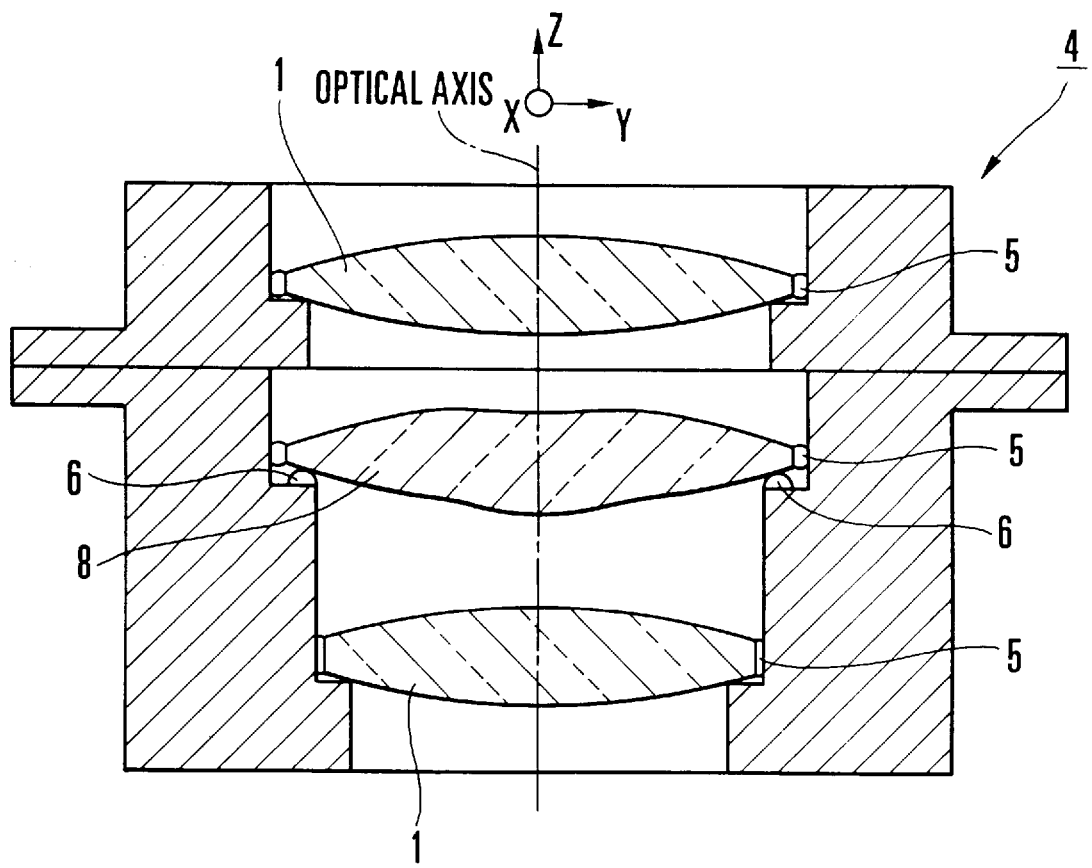
F I G. 13
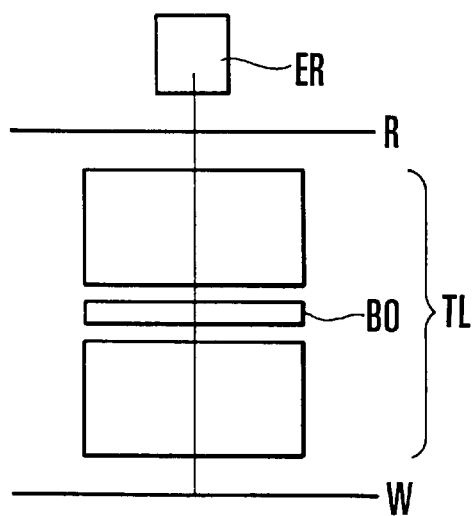

LENS BARREL AND PROJECTION ALIGNER

This is a divisional application of application Ser. No. 09/296,563, filed on Apr. 22, 1999 now U.S. Pat. No. 6,285,512.

BACKGROUND OF THE INVENTION

1. Field of the Invention

The present invention relates to a lens barrel having an optical element which is deformed by its own weight and/or by being held in position and also to a projection aligner having the lens barrel. More particularly, the present invention relates to a lens barrel having, as such an optical element, for example, a binary-type diffractive optical element and to a projection aligner having the lens barrel.

2. Description of Related Art

Optical systems of the kind having diffractive optical elements have been developed in various manners during recent years. The diffractive optical elements known to be used for the optical systems include, for example, Fresnel zone plates, kinoforms, binary optics and hologram elements.

The diffractive optical element is used for converting an incident wavefront into a predetermined wavefront and has features not possessed by a refraction-type lens. For example, the diffractive optical element has dispersion reverse to that of the refraction-type lens and can be formed thin, so that the whole optical system can be compactly constructed.

Generally, with the diffractive optical element arranged to be in a binary type shape, the diffractive optical element can be manufactured by using the manufacturing technique for semiconductor devices. With such a manufacturing technique applied, the diffractive optical element can be manufactured without difficulty to have fine pitches. In view of this, researches are being actively conducted for a binary-type diffractive optical element of the blazed shape which approximates to a stepped shape.

Meanwhile, various methods have been employed for positioning optical elements, such as a diffractive optical element, a lens, etc., within a lens barrel. The known methods include a lens pressing method, a throw-in method, etc.

FIG. 1 shows in outline the structural arrangement of a lens barrel in which optical elements are positioned by the lens pressing method. Referring to FIG. 1, lenses 8 are arranged to constitute a projection optical system. The lens barrel 9 is arranged to hold the lenses 8. Retaining rings 10 are arranged in the lens barrel 9 to fix the lenses 8 to their positions by causing the lenses 8 to abut on the respective lens setting parts "a" of the lens barrel 9.

The outside shapes of the lenses 8 are beforehand cut to be coaxial with respect to a lens optical axis La by machining to a predetermined degree of precision, and the outside diameters of them are beforehand measured and determined also to a predetermined degree of precision.

The inside diameter of the lens barrel 9 is beforehand cut and determined according to the outside diameters of the lenses 8 measured, in such a way as to have a predetermined clearance between the inside diameter of the lens barrel 9 and the outside diameter of each of the lenses 8 when the lenses 8 are fitted in the lens barrel 9.

The lenses 8 are positioned in the direction of the optical axis La by screwing a male screw part formed on the peripheral part of each of the retaining rings 10 into the corresponding one of female screw parts 90 formed in the inner side wall of the lens barrel 9. Each of the retaining rings 10 is thus screwed to cause each of the lenses 8 to abut on the corresponding lens setting part "a", so that the lenses 8 are fixed in position.

In the case of the conventional lens barrel shown in FIG. 1, since each of the lenses 8 is pushed against the corresponding lens setting part "a", the surface shape of each of the lenses 8 tends to be deformed according to the shape of the retaining ring 10 and the shape of the lens setting part "a". Such deformation has presented such a problem as to cause the optical characteristics of the lenses 8 to vary, To solve the above problem, it is possible to lessen a pushing force on the lens 8, by sticking the lens 8 to the inner wall of the lens barrel 9 by adhesives without using the retaining ring 10. However, in a case where the direction of the optical axis coincides with the direction of gravitation, the lens 8 might be sometimes deformed by its own weight to some extent and in some directions according to the shape of the lens setting part "a".

It is difficult to machine the lens setting part with its flatness kept more accurate than the flatness of the lens surface. It is also difficult to accurately presume the deformation of the lens abutting on the lens setting part beforehand, because the shape of the lens setting part in each of lens barrels differs from that in another lens barrel. Therefore, in the case of an optical system where even a minute amount of deformation is considered to be a serious drawback, the optical performance of the optical system must be evaluated after assembly work of the optical system and the posture or position of each lens must be adjusted according to the result of the evaluation in a prescribed manner to correct various aberrations resulting from the surface deformation. Accordingly, the number of necessary assembly and adjustment processes has been increased by such additional processes that are necessary.

Further, in a case where a thin optical element such as a diffractive optical element or the like is to be held by a lens barrel, in particular, the amount of the above-stated deformation becomes too much to obtain a desired optical performance by adjusting the posture or position of the optical element.

BRIEF SUMMARY OF THE INVENTION

The invention is directed to the solution of the above-stated problems of the prior art. Therefore, it is an object of the invention to provide a lens barrel and a projection aligner, which improve upon the prior art.

To attain the above object, in accordance with an aspect of the invention, there is provided a lens barrel, which comprises an optical element having a light-transmissive surface which is deformed by its own weight and/or by being supported, and a plurality of protrusive parts which support the optical element, the plurality of protrusive parts being disposed in such a way as to enable the light-transmissive surface of the optical element to be deformed symmetrically with respect to a plane which includes an optical axis.

Further, in the lens barrel, when the optical element includes a pair of optical elements, the pair of optical elements are arranged to mutually correct variations of optical characteristics thereof caused by deformation thereof.

Further, the lens barrel further comprises a lens which corrects a variation of optical characteristics of the optical element caused by deformation of the optical element.

Further, in the lens barrel, each of the plurality of protrusive parts are arranged to be substantially in point-contact with the optical element.

Further, in the lens barrel, positions of the plurality of protrusive parts in a direction of the optical axis are the same.

Further, in the lens barrel, the number of the plurality of protrusive parts is two, three, four, five, six, seven, eight or nine.

Further, in the lens barrel a plurality of points of a peripheral part of the optical element are stuck to an inner wall of the lens barrel by an adhesive.

Further, in the lens barrel, the optical element is a lens or a mirror.

Further, in the lens barrel, the optical element is a diffractive optical element.

Further, the lens barrel further comprises a plurality of optical elements each having a light-transmissive surface which is substantially deformed by its own weight and/or by being pressed, the plurality of optical elements including lenses and/or mirrors.

Further, in the lens barrel, each of the plurality of protrusive parts is in a semispherical shape or pin-like shape.

Further, in the lens barrel, the plurality of protrusive parts are disposed in such a way as to enable the light-transmissive surface to be deformed symmetrically with respect to both a first plane which includes the optical axis and a second plane which includes the optical axis and is perpendicular to the first plane.

In accordance with an other aspect of the invention, there is provided a lens barrel, which comprises an optical element having a surface which is deformed by its own weight, and means for supporting the optical element so that the surface of the optical element is deformed symmetrically with respect to at least one plane which includes an optical axis substantially only by its own weight.

In accordance with a further aspect of the invention, there is provided a lens barrel, which comprises an optical element having a surface which is deformed by its own weight and by being supported, and means for supporting the optical element so that the surface of the optical element is deformed symmetrically with respect to at least one plane which includes an optical axis substantially only by its own weight and by being supported.

In accordance with a further aspect of the invention, there is provided a lens barrel, which comprises a plurality of optical elements, the plurality of optical elements including a lens and/or a mirror, at least one optical element having a light-transmissive surface which is deformed by its own weight and/or by being supported, and two, three or four protrusive parts which support the at least one optical element, positions of the two, three or four protrusive parts in a direction of an optical axis being the same, each of the two, three or four protrusive parts being arranged to be substantially in point-contact with the at least one optical element, the two, three or four protrusive parts being disposed in such a way as to enable the light-transmissive surface to be deformed symmetrically with respect to both a first plane which includes the optical axis and a second plane which includes the optical axis and is perpendicular to the first plane.

In accordance with a further aspect of the invention, there is provided a projection aligner, which comprises the lens barrel, the lens barrel having a projecting optical system which includes the optical element, a pattern formed on a mask being projected by the projecting optical system onto a substrate to be exposed.

In accordance with a still further aspect of the invention, there is provided a device manufacturing method for manufacturing a device by using the projection aligner, a mask having a circuit pattern and a substrate to be exposed.

The above and further objects and features of the invention will become apparent from the following detailed description of preferred embodiments thereof taken in conjunction with the accompanying drawings.

BRIEF DESCRIPTION OF THE SEVERAL VIEWS OF THE DRAWING

FIG. 12 is a sectional view showing in outline the essential parts of a lens barrel according to a third embodiment of the invention.

FIG. 13 is a sectional view showing in outline the essential parts of a projection aligner according to a fourth embodiment of the invention.

DETAILED DESCRIPTION OF THE INVENTION

Hereinafter, preferred embodiments of the invention will be described in detail with reference to the drawings.

Figure 1:
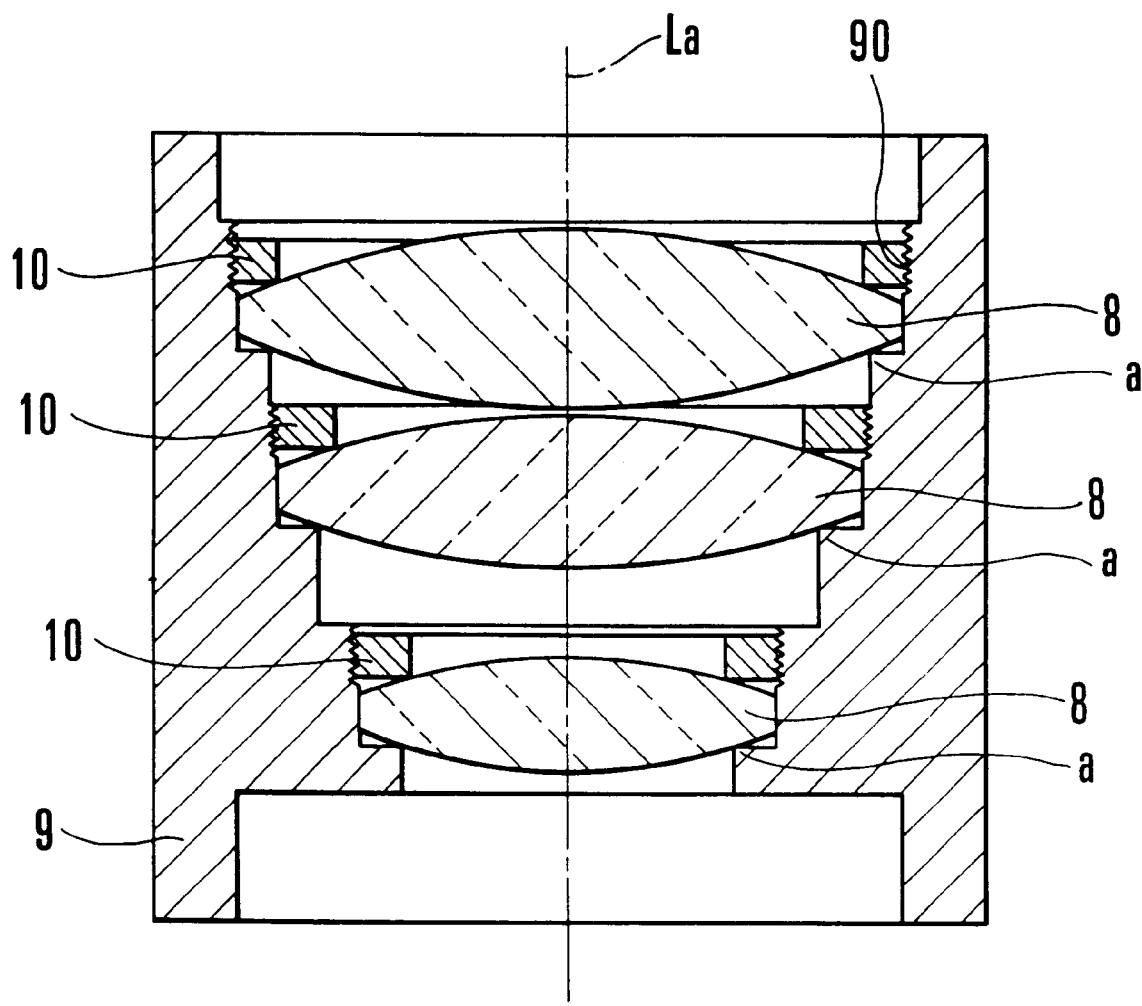
FIG. 1 is a sectional view showing in outline the arrangement of the conventional lens barrel.
Figure 2:
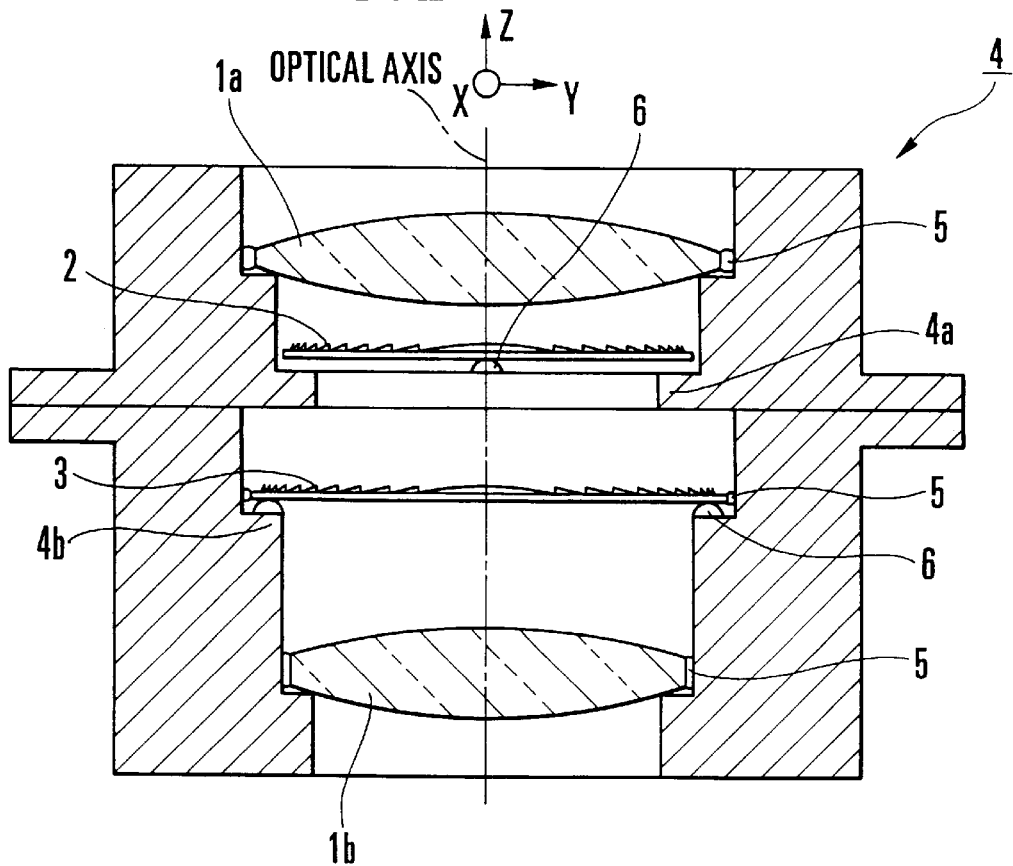
FIG. 2 is a sectional view showing in outline the essential parts of a lens barrel according to a first embodiment of the invention.

FIGS. 2 to 7 relate to a first embodiment of the invention. FIG. 2 is a sectional view showing in outline the essential parts of a lens barrel 4 according to the first embodiment of the invention. Referring to FIG. 2, the direction of gravitation coincides with the direction of an optical axis, which is indicated as the direction of −Z. Refraction lenses 1 (1a and 1b) constitute an optical system. Each of diffractive optical elements 2 and 3 is formed by coaxially forming, in concentric circles, a diffraction grating pattern of the blazed shape on the surface of a glass base plate. The diffractive optical elements 2 and 3 are supported by support members 4a and 4b of the lens barrel 4 through spherical protrusive members 6 which will be described later herein.

The lens barrel 4 is arranged to house the optical system. In the lens barrel 4, the support members 4a and 4b are arranged to fixedly set the refraction lens 1a, the diffractive optical element 2, the refraction lens 1b and the diffractive optical element 3 in their positions with adhesives 5 at predetermined spacing intervals in the direction of the optical axis. The support members 4a and 4b are secured to the lens barrel 4 with screws (not shown) in such a way as to have the optical axes of the respective optical elements coincide with each other.

Figure 3:
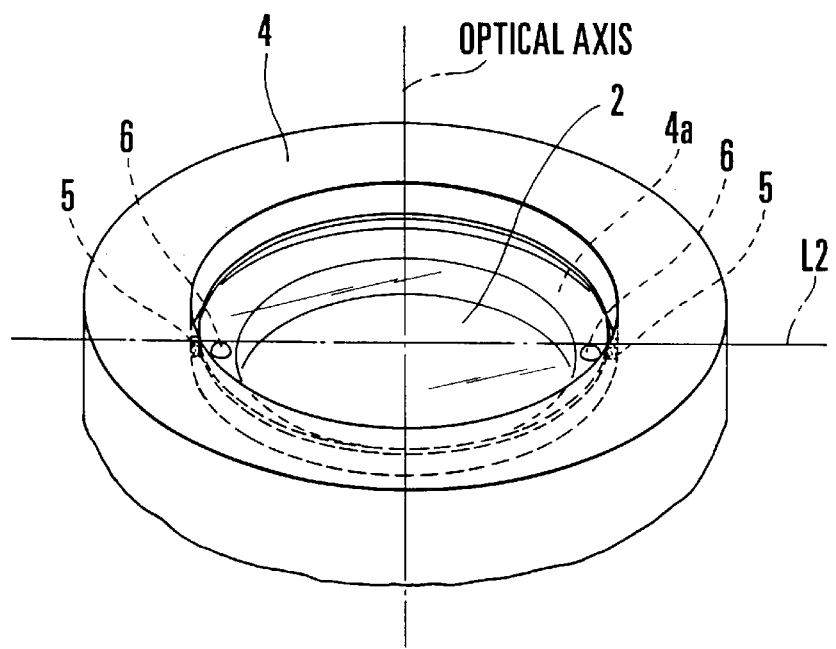
FIG. 3 is a perspective view showing the details of parts at which a diffractive optical element shown in FIG. 2 is positioned.

FIG. 3 shows the details of a structure by which the diffractive optical element 2 is positioned on the inner wall of the lens barrel 4. The other diffractive optical element 3 is also positioned by a structure which is similar to the positioning structure shown in FIG. 3. Referring to FIG. 3, the two spherical protrusive members 6 are arranged, at equal distances from the optical axis, on an axis L2 (first perpendicular axis), which is perpendicular to the optical axis and is included in a plane perpendicular to the optical axis on the support member 4a. The apexes of the two protrusive members 6, which are located at symmetrical positions with respect to a plane XZ, are disposed within one and the same plane which is perpendicular to the optical axis (i.e., in the same position as viewed in the direction of the optical axis). Then, the apexes of the spherical protrusive members 6 are arranged to be substantially in point-contact with the diffractive optical element 2.

Incidentally, the spherical protrusive members 6 may be replaced with pin-like protrusive members having minute planes at their end parts. In that instance, the two minute plane parts are located within the above-stated one and the same plane which is perpendicular to the optical axis (i.e., in the same position as viewed in the direction of the optical axis).

The diffractive optical element 2 is thus in contact directly with the support member 4a only at the apexes or the minute plane parts of the protrusive members 6. Further, the adhesive 5 is applied to the peripheral part of the diffractive optical element 2 only at areas in the neighborhood of the protrusive members 6. Accordingly, the diffractive optical element 2 never turns around the axis L2, and the peripheral parts of the diffractive optical element 2 other than the areas having the adhesive 5 are left deformable by the own weight of the diffractive optical element 2. In this instance, the facial shapes of light-entrance and light-exit surfaces of the diffractive optical element 2 obtained after deformation are symmetric with respect to the plane XZ, while the facial shapes of light-entrance and light-exit surfaces of the other diffractive optical element 3 obtained after deformation are symmetric with respect to a plane YZ.

Figure 4:
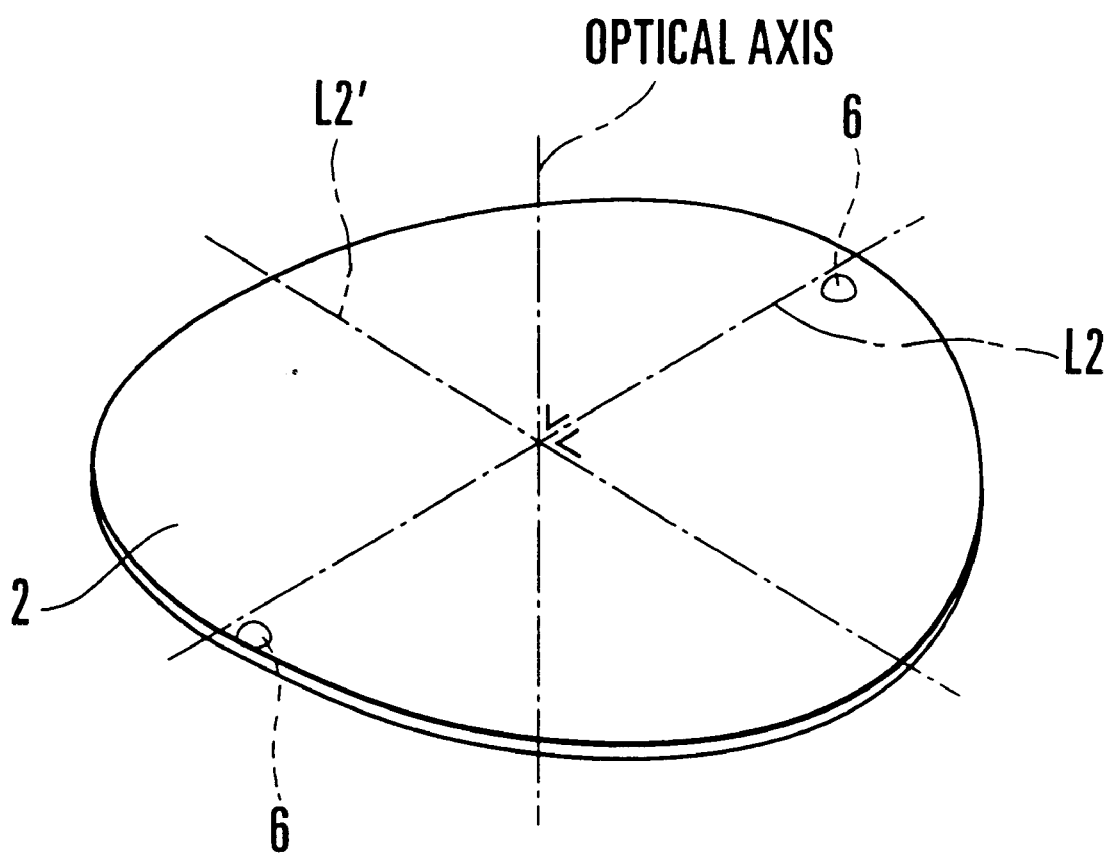
FIG. 4 is a perspective view showing a state in which the diffractive optical element shown in FIG. 2 is deformed by its own weight.

In the case of the arrangement of the prior art example described in the foregoing, it is hardly possible to predict or presume how a lens abutting on a lens setting part of the support member will be deformed, because the exact shape of the lens setting part of the support member varies with individual manufactured products thereof. According to the holding method of the first embodiment described above, on the other hand, the diffractive optical element 2 is presumable to be deformed by its own weight in a manner approximately symmetric with respect to both the axis L2 and an axis L2' (second perpendicular axis) which is perpendicular to the axis L2, i.e., with respect to both the planes XZ and YZ, as shown in FIG. 4. The amount of deflection (warp) taking place at each point of the diffractive optical element 2 or 3 can be precisely computed at the time of designing the optical system by the finite-element method or the like.

Figure 5:
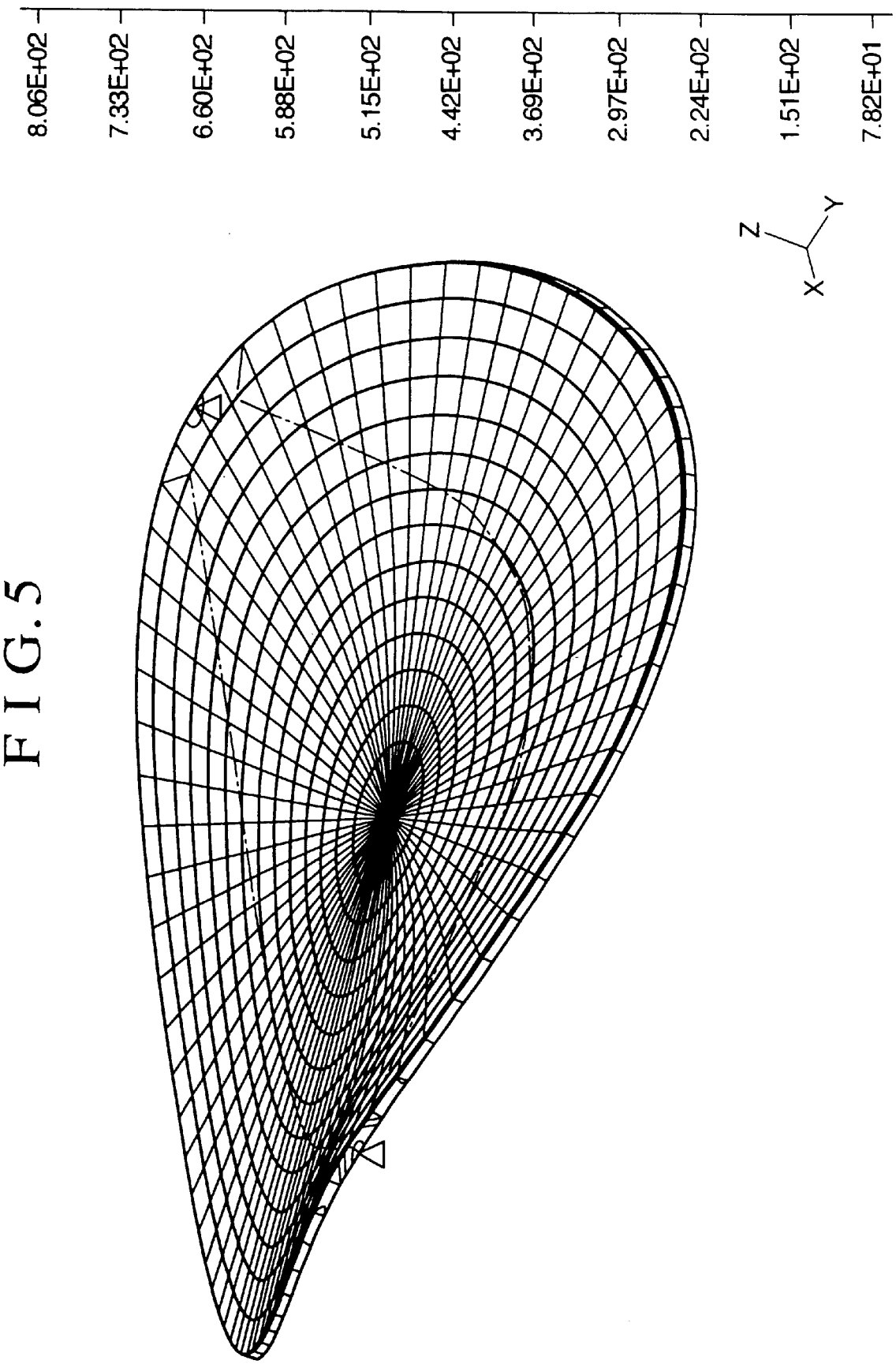
FIG. 5 is a diagram for explaining the result of a computing operation by a finite-element method on the deformation of the diffractive optical element shown in FIG. 2 caused by its own weight.

FIG. 5 depicts a result of computation by the finite-element method of a deformed state of the diffractive optical element which is used in the first embodiment and which measures 1 mm in thickness.

It is also possible to find beforehand how the diffractive optical element will be deformed through experiments and tests without recourse to a computing operation. Such an experimental method also gives an adequate reproducibility of the deformation of the diffractive optical element.

Figure 6:
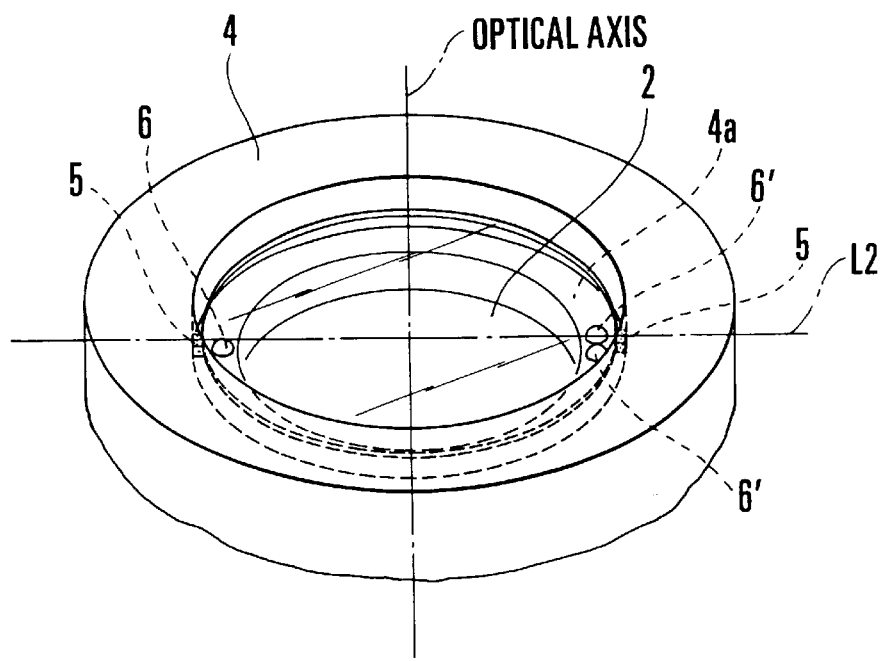
FIG. 6 is a perspective view for explaining a case where spherical members for positioning the diffractive optical element shown in FIG. 2 are disposed at three parts.

In the case of the first embodiment, the posture of the diffractive optical element 2 is arranged to be set by restricting the diffractive optical element 2 from turning around the axis L2, by means of the adhesive 5. However, this arrangement may be changed to set the posture of the diffractive optical element 2 by replacing one of the protrusive members 6 with protrusive members 6' which are disposed at two parts in the neighborhood of the axis L2 on the support member 4a, as shown in FIG. 6.

In that instance, the two protrusive members 6' are disposed near at equal distances from the axis L2 in such a way as to allow the diffractive optical element 2 to symmetrically deform with respect to both the axis L2 and the axis L2'. In addition, the apex of the protrusive member 6 and the apexes of the two protrusive members 6' are arranged to be within one and the same plane which is perpendicular to the optical axis (i.e., in the same position as viewed in the direction of the optical axis).

Figure 7:
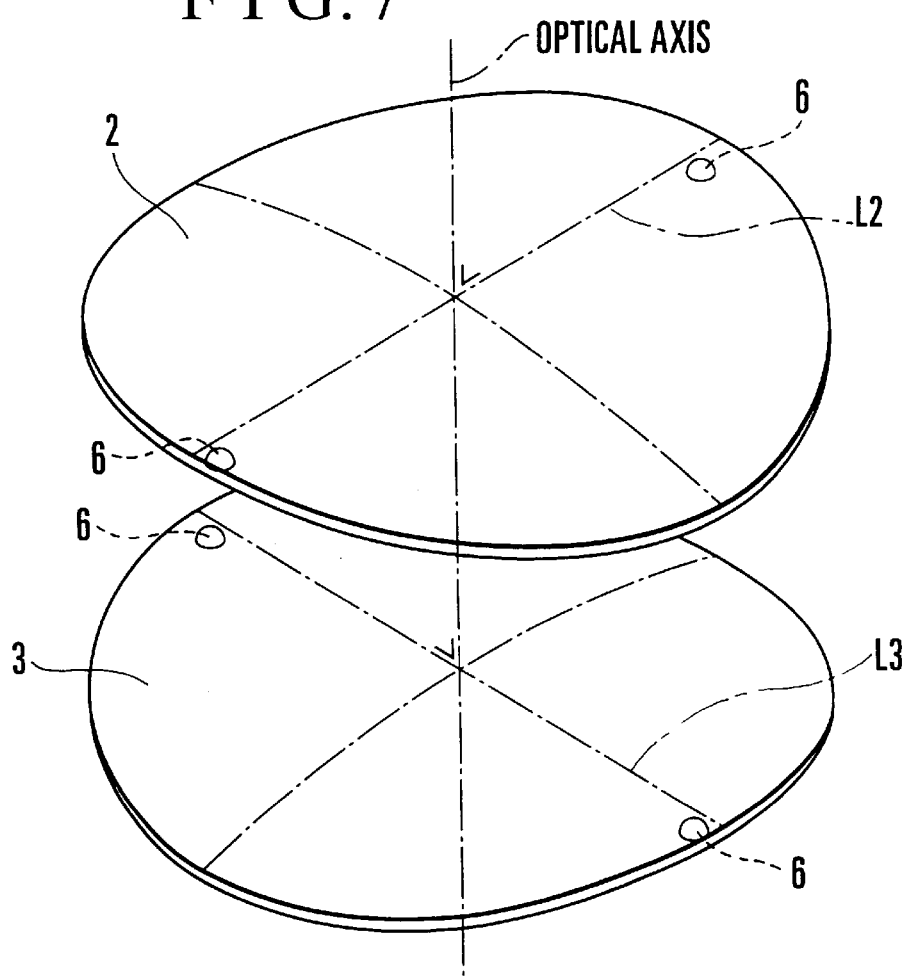
FIG. 7 schematically shows relative positions of two diffractive optical elements shown in FIG. 2.

FIG. 7 is a diagram for explaining a case where, for the purpose of correcting the computed various aberrations, such as astigmatism, difference between longitudinal and lateral magnifications, etc., resulting from deformation caused by their own weights when the two diffractive optical elements 2 and 3 shown in FIG. 2 are held in the above-stated manner respectively on the support members 4a and 4b, the diffractive optical elements 2 and 3 are set in such a way as to have the axes L2 and L3 which are datum axes of their deformations perpendicular to each other.

In this case, the deformation of one of the two diffractive optical elements 2 and 3 is arranged to be a correcting optical element for correcting the deformation of the other of the two diffractive optical elements 2 and 3. It is also possible to use an anamorphic lens which is undeformable or deformable, as one of the two diffractive optical elements.

According to the arrangement of the first embodiment described above, the aberrations of the optical system is accurately presumable at the time when the specifications of design of the diffractive optical elements are decided before the optical system is assembled. Therefore, a correcting optical system can be designed to correct the aberrations, so that the number of necessary assembly processes can be lessened without fail.

Further, since the deformation of the diffractive optical element is presumable even if the amount of deformation of the diffractive optical element is too much to correct the aberrations, an optical design can be adjusted to change, for example, the thickness, etc., of the diffractive optical element so as to correct the presumed amount of deformation before machining and assembly processes. The first embodiment thus permits an improvement also in yield of products.

In the first embodiment described above, the arrangement according to the invention is applied to a case where thin diffractive optical elements which tend to deform due to their own weights and/or due to the state of being held with the support members of the lens barrel are used. The optical characteristics of the optical elements and the whole optical system including the optical elements are then affected by their deformations to a relatively great extent. The arrangement according to the invention is of course likewise applicable also to cases where optical elements which tend to deform, such as refractive lenses and reflecting mirrors, are arranged to be held in place. Further, it is conceivable that there are cases where optical elements other than deformable optical elements are not only lenses but also mirrors or mirrors combined with lenses. It will be appreciated that optical elements 2 and 3 as shown in FIGS. 2–7 are representative of lenses and/or mirrors. Therefore, the term "lens barrel" as used in describing the invention is not limited to a lens barrel containing lenses but may be an optical barrel which does not contain any lens therein.

Figure 8:
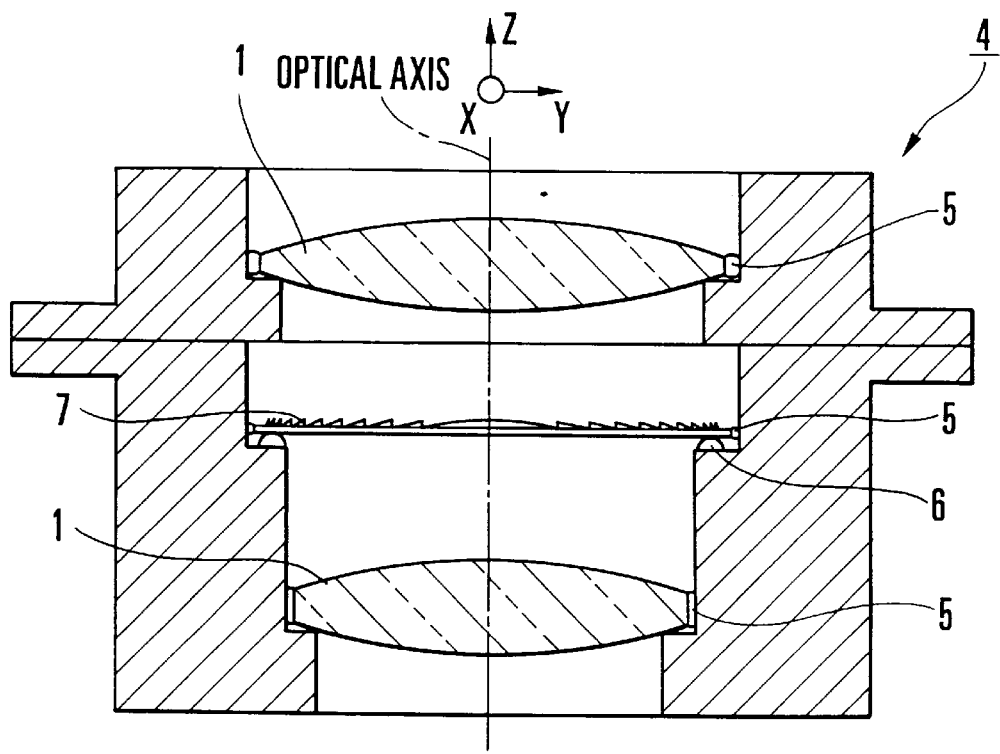
FIG. 8 is a sectional view showing in outline the essential parts of a lens barrel according to a second embodiment of the invention.

Next, a second embodiment of the invention will be described with reference to FIGS. 8 to 11. FIG. 8 schematically shows the essential parts of a lens barrel according to the second embodiment of the invention. In FIG. 8, the same reference numerals as those of FIG. 2 which shows the first embodiment denote the same members. The direction of gravitation coincides with the direction of the optical axis of the lens barrel, which is indicated as the direction of –Z in FIG. 8.

Referring to FIG. 8, in the second embodiment, there is used a diffractive optical element 7, which has a diffraction grating formed in a blazed pattern on the surface of a glass base plate.

Figure 9:
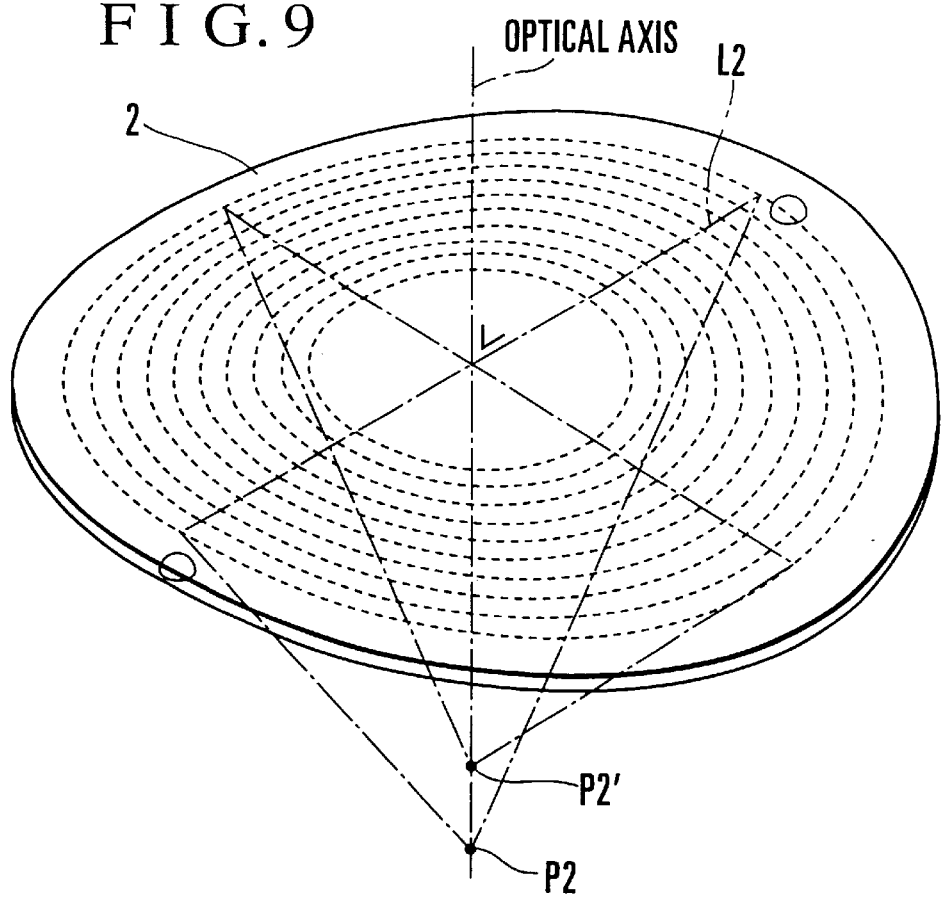
FIG. 9 schematically shows a diffraction grating pattern of the diffractive optical element shown in FIG. 2 and a focus position of the diffractive optical element obtained in a state of being deformed by its own weight.

FIG. 9 shows a focus position obtained when the diffractive optical element 2 shown in FIG. 2 is in a state of being deformed by its own weight. Broken lines in FIG. 9 show boundaries of a ring-zonal diffraction grating pattern. In the case of the diffractive optical element 2 shown in FIG. 9, the ring-zonal diffraction grating pattern is composed of cyclic zones which are concentric with respect to the optical axis. A spacing distance between one ring-like zone and another in the ring-zonal diffraction grating pattern (hereinafter referred to as the pitch of the diffraction grating pattern) is constant in the direction of circumference. Therefore, in a state in which the diffractive optical element 2 is deformed by its own weight, a focus position P2 within a plane including the optical axis and the axis L2 shown in FIG. 9 does not coincide with a focus position P2' within a plane perpendicular to the plane of the focus position P2.

Figure 10:
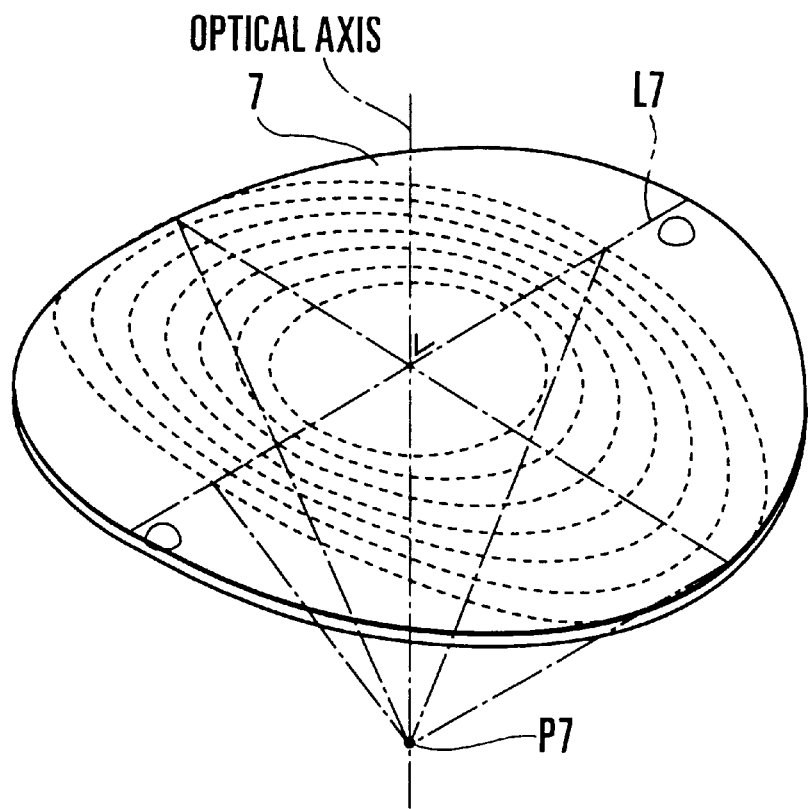
FIG. 10 schematically shows a diffraction grating pattern of a diffractive optical element shown in FIG. 8 and a focus position of the diffractive optical element obtained in a state of being deformed by its own weight.

FIG. 10 shows a focus position of the diffractive optical element 7 used in the second embodiment. As shown in FIG. 10, the pitch of the diffraction grating pattern is so designed as to become narrower in the direction of the symmetry axis L7 of deformation and wider in a direction perpendicular thereto, in such a way as to cause a focus position P7 within a plane including the optical axis and the axis L7 to coincide with a focus position within a plane which is perpendicular to the former plane when the diffractive optical element 7 is deformed by its own weight within the lens barrel 4.

The first embodiment is arranged to correct the aberrations resulting from the deformation by combining a plurality of diffractive optical elements. In the second embodiment, one the other hand, the diffraction grating pattern is designed to optimize a pitch distribution by varying the diffraction grating pitch obtained before the deformation of the diffractive optical element 7 in such a way as to obtain desired optical characteristics with the diffractive optical element 7 in a deformed state due to its own weight. By virtue of this arrangement, the desired optical characteristics can be obtained after the diffractive optical element 7 is deformed without recourse to any additional correcting optical system. The optical system thus can be compactly arranged.

The reduction in number of optical elements of the optical system, which is possible according to the arrangement of the second embodiment, also gives advantages such as improvement in transmission factor, mitigation of flares, etc.

Figure 11A:
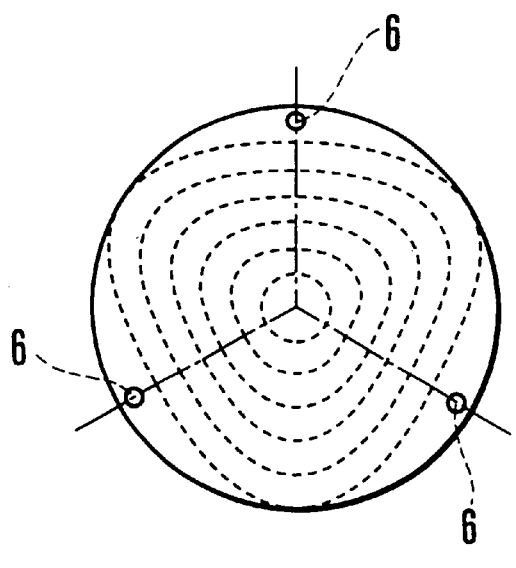
FIGS. 11(A) and 11(B) are diagrams for explaining cases where protrusive members for positioning a diffractive optical element are disposed at three parts and at four parts, respectively.
Figure 11B:
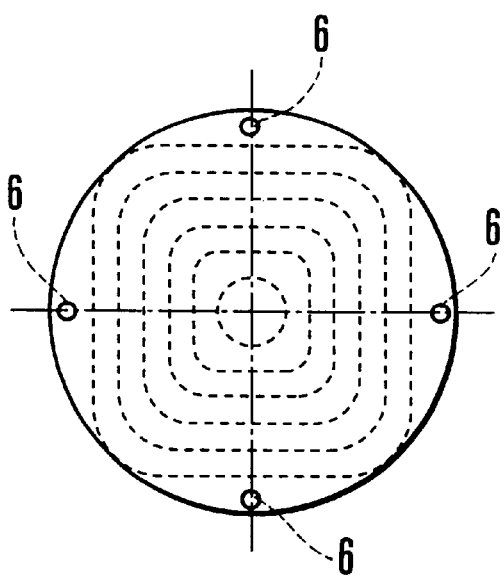

The number and positions of the plurality of protrusive members arranged to support the diffractive optical element are not limited to the arrangement of the second embodiment disclosed but may be changed as desired. For example, the number of parts at which the diffractive optical element is to be supported are not limited to two but may be three or four, as shown in FIGS. 11(A) or 11(B), or may be changed to five, six, seven, eight or nine, as desired. In each of such modifications of the diffractive optical element, however, it is necessary to produce a multiple ring-zonal diffraction grating in which the pitch of ring zones of the diffraction grating pattern is varied according to the direction and the amount of deformation, as indicated by broken lines in FIGS. 11(A) and 11(B).

In a case where there is used a binary-type diffractive optical element in which the blazed shape (sectional shape as viewed along a plane including the optical axis) of the ring-zonal diffraction grating pattern approximates to a stepped shape composed of a plurality of steps, the diffractive optical element may be manufactured by a known method wherein the pattern on an original plate is transferred to the glass base plate by means of an exposure apparatus used in the manufacture of semiconductor products. In that instance, it is of course necessary that the pattern on the original plate be so manufactured as to enable the diffraction grating pattern having the pitch varied with the parts of the pattern to be transferred to the glass base plate.

Further, the same advantageous effects can be also attained by an exposure transfer process carried out on the pattern of the original plate which is concentric under the non-loaded state, by in-plane deforming at least one of the original plate and the glass base plate.

A third embodiment of the invention is next described with reference to FIG. 12. FIG. 12 schematically shows the arrangement of a lens barrel according to the third embodiment of the invention. In FIG. 12, the same reference numerals as those used for the first embodiment indicate the same members. The direction of gravitation coincides with the direction of an optical axis, i.e., the direction of –Z indicated in FIG. 12.

In the case of the third embodiment, the optical-element holding method employed for the first embodiment is applied to an ordinary, spherical lens 8 of a surface shape which is rotationally symmetric around the optical axis. The spherical lens 8, which is supported by spherical members 6 disposed at two parts spaced 180 degrees, is arranged to deform due to its own weight to form an aspherical surface shape which is symmetric with respect to both a plane XZ and a plane YZ. Therefore, it is possible to make an optical design by computing beforehand the aberrations, such as astigmatism and a difference between longitudinal and lateral magnifications, which take place, for example, with the spherical lens 8 held in position. With the optical design made in this manner, an optical performance which is equal to the optical performance of an optical system using an aspherical lens can be attained in the third embodiment. Further, the lens 8 in the third embodiment (aspherical lens) may be used as a correcting optical system for correcting the aberrations of an assembled optical system.

The number of parts where the spherical members 6 are to be disposed is of course not limited to the two parts spaced 180 degrees. These lens holding members 6 may be arranged at three or four parts. Further, the above-stated holding method may be applied to an aspherical lens.

FIG. 13 schematically shows the arrangement of essential parts of a projection aligner adapted for the manufacture of semiconductor devices, to which a lens barrel according to the invention is applied, according to a fourth embodiment thereof. Referring to FIG. 13, a circuit pattern provided at a reticle (first object) R which is illuminated with exposure light from an illumination system ER is projected by means of a projecting optical system TL onto the surface of a wafer (photosensitive substrate) W. The projecting optical system TL includes a lens barrel having an element BO which is deformable as described in each of the first to third embodiments. Then, the various processes, such as developing and etching, are performed on the wafer W which has been exposed with images of the circuit pattern, so that a semiconductor device is manufactured.

What is claimed is:

1. A lens barrel comprising:
   a plurality of optical elements deformed rotationally asymmetrically with respect to an optical axis of the lens barrel, an optical characteristic of each of said plurality of optical elements being rotationally asymmetrical with respect to the optical axis by the deformation; and
   means for supporting said plurality of optical elements, so as to enable optical characteristics of said lens barrel to be substantially rotationally symmetrical with respect to the optical axis.

2. A lens barrel according to claim 1, wherein said supporting means includes a plurality of protrusive parts.

3. A lens barrel according to claim 2, wherein each of said plurality of protrusive parts is in a semispherical shape or pin-like shape.

4. A lens barrel according to claim 1, wherein said supporting means is arranged to be substantially in point-contact with said optical elements.

5. A lens barrel according to claim 4, wherein each of said optical elements is substantially in point-contact with said supporting means at two, three, four, five, six, seven, eight or nine points.

6. A lens barrel according to claim 1, wherein a peripheral part of each of said optical elements is stuck at plural points to an inner wall of said lens barrel by an adhesive.

7. A lens barrel according to claim 1, wherein at least one of said optical elements is a diffractive optical element.

8. A lens barrel according to claim 7, wherein said optical elements are diffractive optical elements.

9. A projection aligner comprising a lens barrel according to claim 1,
   wherein said aligner projects a pattern formed on a mask onto a substrate to be exposed.

10. A device manufacturing method for manufacturing a device by using a projection aligner according to claim 9, a mask having a circuit pattern and a substrate to be exposed.

11. A lens barrel comprising:
    an optical element deformed rotationally asymmetrically with respect to its own optical axis, an optical characteristic of said optical element being rotationally asymmetrical with respect to the optical axis by the deformation;
    means for supporting said optical element, so as to enable said optical element to be deformed rotationally asymmetrically with respect to its own optical axis; and
    at least one optical system which has an optical characteristic, said optical characteristic being rotationally asymmetrical with respect to the optical axis,
    wherein an optical characteristic combining the optical characteristic of said optical element with that of said at least one optical system is substantially rotationally symmetrical with respect to the optical axis.

12. A lens barrel according to claim 11, wherein said supporting means includes a plurality of protrusive parts.

13. A lens barrel according to claim 12, wherein each of said plurality of protrusive parts is in a semispherical shape or pin-like shape.

14. A lens barrel according to claim 11, wherein said supporting means is arranged to be substantially in point-contact with said optical element.

15. A lens barrel according to claim 11, wherein said optical element is substantially in point-contact with said supporting means at two, three, four, five, six, seven, eight or nine points.

16. A lens barrel according to claim 11, wherein a peripheral part of said optical element is stuck at plural points to an inner wall of said lens barrel by an adhesive.

17. A lens barrel according to claim 11, wherein said optical element is a diffractive optical element.

18. A projection aligner comprising a lens barrel according to claim 11,
    wherein said aligner projects a pattern formed on a mask onto a substrate to be exposed.

19. A device manufacturing method for manufacturing a device by using a projection aligner according to claim 18, a mask having a circuit pattern and a substrate to be exposed.

20. A lens barrel comprising:
    a plurality of mirrors deformed rotationally asymmetrically with respect to an optical axis of the lens barrel, an optical characteristic of each of said plurality of mirrors being rotationally asymmetrical with respect to the optical axis by the deformation; and
    means for supporting said plurality of mirrors, so as to enable an optical characteristic of said lens barrel to be substantially rotationally symmetrical with respect to the optical axis.

21. A lens barrel according to claim 20, wherein said supporting means includes a plurality of protrusive parts.

22. A lens barrel according to claim 21, wherein each of said plurality of protrusive parts is in a semispherical shape or pin-like shape.

23. A lens barrel according to claim 20, wherein said supporting means is arranged to be substantially in point-contact with said mirrors.

24. A lens barrel according to claim 23, wherein each of said mirrors is substantially in point-contact with said supporting means at two, three, four, five, six, seven, eight or nine points.

25. A lens barrel according to claim 20, wherein a peripheral part of each of mirrors is stuck at plural points to an inner wall of said lens barrel by an adhesive.

26. A projection aligner comprising a lens barrel according to claim 20,
    wherein said aligner projects a pattern formed on a mask onto a substrate to be exposed.

27. A device manufacturing method for manufacturing a device by using a projection aligner according to claim 26, a mask having a circuit pattern and a substrate to be exposed.

28. A lens barrel comprising:
    a mirror deformed rotationally asymmetrically with respect to its own optical axis, an optical characteristic of said mirror being rotationally asymmetrical with respect to the optical axis by the deformation;

means for supporting said mirror, so as to enable said mirror to be deformed rotationally asymmetrically with respect to its own optical axis; and at least one mirror optical system which has an optical characteristic, said optical characteristic being rotationally asymmetrical with respect to its own optical axis, wherein an optical characteristic combining the optical characteristic of said mirror with that of said at least one mirror optical system is substantially rotationally symmetrical with respect to the optical axis.

29. A lens barrel according to claim 28, wherein said supporting means includes a plurality of protrusive parts.

30. A lens barrel according to claim 28, wherein said supporting means is arranged to be substantially in point-contact with said mirror.

31. A lens barrel according to claim 28, wherein said mirror is substantially in point-contact with said supporting means at two, three, four, five, six, seven, eight or nine points.

32. A lens barrel according to claim 28, wherein each of said plurality of protrusive parts is in a semispherical shape or pin-like shape.

33. A lens barrel according to claim 28, wherein a peripheral part of said mirror is stuck at plural points to an inner wall of said lens barrel by an adhesive.

34. A projection aligner comprising a lens barrel according to claim 28, wherein said aligner projects a pattern formed on a mask onto a substrate to be exposed.

35. A device manufacturing method for manufacturing a device by using a projection aligner according to claim 34, a mask having a circuit pattern and a substrate to be exposed.

36. An optical apparatus comprising:

an optical system including a plurality of optical elements deformed rotationally asymmetrically with respect to an optical axis of said optical system, an optical characteristic of each of said plurality of optical elements being rotationally asymmetrical with respect to the optical axis of said optical system by the deformation; and means for supporting said plurality of optical elements, so as to enable a characteristic of the optical system to be substantially rotationally symmetrical with respect to the optical axis of said optical system.

37. An apparatus according to claim 36, wherein at least one of said plurality of optical elements is a mirror.

38. An apparatus according to claim 36, wherein said plurality of optical elements are mirrors.

39. An apparatus according to claim 36, wherein said supporting means includes a plurality of protrusive parts.

40. An apparatus according to claim 39, wherein each of said plurality of protrusive parts is in a semispherical shape or pin-like shape.

41. An apparatus according to claim 36, wherein said supporting means is arranged to be substantially in point-contact with said optical elements.

42. An apparatus according to claim 36, wherein each of said optical elements is substantially in point-contact with said supporting means at two, three, four, five, six, seven, eight or nine points.

43. An apparatus according to claim 36, wherein a peripheral part of each of said optical elements is stuck at plural points to an inner wall of said lens barrel by an adhesive.

44. A projection aligner comprising an apparatus according to claim 36, wherein said aligner projects a pattern formed on a mask onto a substrate to be exposed.

45. A device manufacturing method for manufacturing a device by using a projection aligner according to claim 44, a mask having a circuit pattern and a substrate to be exposed.

46. An optical apparatus comprising:

an optical system including a plurality of optical elements; and means for supporting said plurality of optical elements, so as to enable said plurality of optical elements to be deformed rotationally asymmetrically with respect to an optical axis of said optical system, and to enable a characteristic of said optical system to be substantially rotationally symmetrical with respect to the optical axis.

47. An apparatus according to claim 46, wherein at least one of said plurality of optical elements is a mirror.

48. An apparatus according to claim 46, wherein said plurality of optical elements are mirrors.

49. An apparatus according to claim 46, wherein said supporting means includes a plurality of protrusive parts.

50. An apparatus according to claim 49, wherein each of said plurality of protrusive parts is in a semispherical shape or pin-like shape.

51. An apparatus according to claim 46, wherein said supporting means is arranged to be substantially in point-contact with said optical elements.

52. An apparatus according to claim 46, wherein each of said optical elements is substantially in point-contact with said supporting means at two, three, four, five, six, seven, eight or nine points.

53. An apparatus according to claim 46, wherein a peripheral part of each of said optical elements is stuck at plural points to an inner wall of said lens barrel by an adhesive.

54. A projection aligner comprising an apparatus according to claim 46, wherein said aligner projects a pattern formed on a mask onto a substrate to be exposed.

55. A device manufacturing method for manufacturing a device by using a projection aligner according to claim 54, a mask having a circuit pattern and a substrate to be exposed.

56. A projection aligner according to claim 44, wherein, in an optical system including a plurality of optical elements, at least one of the optical elements is a mirror.

57. A projection aligner according to claim 44, wherein, in an optical system including a plurality of optical elements, all of the optical elements are mirrors.

58. A projection aligner according to claim 54, wherein, in an optical system including a plurality of optical elements, at least one of the optical elements is a mirror.

59. A projection aligner according to claim 54, wherein, in an optical system including a plurality of optical elements, all of the optical elements are mirrors.

60. An optical apparatus comprising:

an optical system including a plurality of optical elements, each of which is deformed rotationally asymmetrically with respect to an optical axis of the optical system, and an optical characteristic of each of said plurality of optical elements being rotationally asymmetrical with respect to the optical axis of the optical system by the deformation, wherein said plurality optical elements are arranged so as to reduce rotational asymmetry of the optical characteristic of said optical system, which is caused by the optical characteristic of each said plurality of optical elements being rotationally asymmetrical with respect to the optical axis of the optical system.

61. An apparatus according to claim 60, further comprising:

supporting means for supporting each of said plurality of optical elements with a plurality of fixed supporting portions, wherein a first position of said fixed supporting portions for supporting some of said optical elements and a second position of said fixed supporting portions for supporting others of said optical elements are different with respect to the rotational direction of the optical axis of said optical system.

62. An apparatus according to claim 60, further comprising:

supporting means for supporting each of said plurality of optical elements with three fixed supporting portions, wherein a first position of said three supporting portions for supporting some of said optical elements and a second position of said three supporting portions for supporting others of said optical elements are different with respect to the rotational direction of the optical axis of said optical system.

63. An apparatus according to claim 60, wherein said plurality of optical elements are mirrors.

64. A projection aligner, comprising an optical apparatus according to claim 60; and an aligner to project a pattern formed on a mask onto a substrate to be exposed by using the optical apparatus.

65. A device manufacturing method for manufacturing a device by using a projection aligner according to claim 64, a mask having a circuit pattern and a substrate to be exposed.

66. An optical apparatus comprising:

an optical system including a plurality of optical elements, each of which is deformed by its own weight, an optical characteristic of each of said plurality of optical elements being changed by the deformation, wherein said plurality of optical elements are arranged so as to reduce a change of an optical characteristic of said optical system, which is caused by the deformation of each of said plurality of optical elements by its own weight.

67. An apparatus according to claim 66, further comprising:

supporting means for supporting each of said plurality of optical elements with a plurality of fixed supporting portions, wherein a first position of said three supporting portions for supporting some of said optical elements and a second position of said fixed supporting portions for supporting others of said optical elements are different with respect to the rotational direction of the optical axis of said optical system.

68. An apparatus according to claim 66, further comprising:

supporting means for supporting each of said plurality of optical elements with three fixed supporting portions, wherein a first position of said three supporting portions for supporting some of said optical elements and a second position of said three supporting portions for supporting others of said optical elements are different with respect to the rotational direction of the optical axis of said optical system.

69. An apparatus according to claim 66, wherein said plurality of optical elements are mirrors.

70. A projection aligner, comprising an optical apparatus according to claim 66; and an aligner to project a pattern formed on a mask onto a substrate to be exposed by using the optical apparatus.

71. A device manufacturing method for manufacturing a device by using a projection aligner according to claim 70, a mask having a circuit pattern and a substrate to be exposed.

* * * * *

UNITED STATES PATENT AND TRADEMARK OFFICE
CERTIFICATE OF CORRECTION

PATENT NO.   : 6,563,652 B2
DATED        : May 13, 2003
INVENTOR(S)  : Yuji Sudoh It is certified that error appears in the above-identified patent and that said Letters Patent is hereby corrected as shown below:

<u>Column 6,</u>
Line 24, "near at" should read -- at nearly --.

<u>Column 7,</u>
Line 61, "one" should read -- on --.

<u>Column 10,</u>
Line 55, "mirrors" should read -- said mirrors --.

Signed and Sealed this

Second Day of December, 2003

JAMES E. ROGAN
*Director of the United States Patent and Trademark Office*